United States Patent
Richter et al.

(10) Patent No.: US 10,890,131 B2
(45) Date of Patent: Jan. 12, 2021

(54) ENGINE SIMULATION SYSTEM AND METHOD

(71) Applicant: MTU FRIEDRICHSHAFEN GMBH, Friedrichshafen (DE)

(72) Inventors: Alexander Bernhard Richter, Oberwurschnitz (DE); Mark Daniel Bowdich, Berkeley, MI (US)

(73) Assignee: MTU FRIEDRICHSHAFEN GMBH, Friedrichshafen (DE)

( * ) Notice: Subject to any disclaimer, the term of this patent is extended or adjusted under 35 U.S.C. 154(b) by 0 days.

(21) Appl. No.: 16/563,431

(22) Filed: Sep. 6, 2019

(65) Prior Publication Data
US 2020/0080506 A1      Mar. 12, 2020

Related U.S. Application Data

(60) Provisional application No. 62/728,247, filed on Sep. 7, 2018.

(51) Int. Cl.
| | | |
|---|---|---|
| *F02D 41/14* | (2006.01) | |
| *G07C 5/00* | (2006.01) | |
| *G07C 5/08* | (2006.01) | |
| *G06F 30/20* | (2020.01) | |

(52) U.S. Cl.
CPC ......... *F02D 41/1401* (2013.01); *G06F 30/20* (2020.01); *G07C 5/004* (2013.01); *G07C 5/0816* (2013.01); *F02D 2041/1437* (2013.01)

(58) Field of Classification Search
CPC ............. F02D 41/1401; F02D 41/1433; F02D 41/1437; F02D 41/266; G06F 30/20; G07C 5/004; G07C 5/0816
See application file for complete search history.

(56) References Cited

U.S. PATENT DOCUMENTS

| | | | |
|---|---|---|---|
| 2006/0157036 A1* | 7/2006 | Andersen ................ | F02B 67/10 123/563 |
| 2008/0133109 A1* | 6/2008 | Carlson ..................... | B60K 6/48 701/102 |
| 2014/0263861 A1* | 9/2014 | Pritchard ................. | B60L 3/08 246/187 R |
| 2016/0247335 A1* | 8/2016 | Daily ................... | G07C 5/0841 |
| 2018/0148005 A1* | 5/2018 | Haines ..................... | F02D 41/28 |

OTHER PUBLICATIONS

AGT Engineering, LS-BRZ/86/FRS PnP CANBUS Translator Overview—Installation and Operating Instructions, pp. 2-3. Year unknown (Year: NA).*

\* cited by examiner

*Primary Examiner* — Sizo B Vilakazi
*Assistant Examiner* — Anthony L Bacon
(74) *Attorney, Agent, or Firm* — Lucas & Mercanti, LLP; Klaus P. Stoffel

(57) ABSTRACT

An engine simulation system and method for replacing an original engine in an existing system of a piece of equipment, including an engine controller from the original engine, a new engine having an engine controller, and a simulator module connected between the engine controller of the new engine and the engine controller of the original engine. The simulator module is configured to simulate that the original engine is still in the existing system.

16 Claims, 4 Drawing Sheets

ENGINE SIMULATION SYSTEM AND METHOD

The present application claims priority of U.S. Provisional Application No. 62/728,247, filed Sep. 7, 2018, the priority of this application is hereby claimed and this application is incorporated herein by reference.

BACKGROUND OF THE INVENTION

The present invention relates to the repowering of equipment and vehicles, such as mining haul trucks, excavators, blast hole drills, generator sets and marine vessels.

Repowering involves replacing an original reciprocating internal combustion engine of the equipment or vehicle. Reciprocating engines and their controllers are conventionally integrated into a system of many controllers (brakes, chassis, hydraulics, etc.) on a piece of equipment. Communication between the controllers is typically serial and often involves the use of proprietary protocols. These proprietary communications undesirably limit the repowering/replacement of the engine to one from the original manufacturer.

SUMMARY OF THE INVENTION

It is an object of the present invention to provide a system and method that allow the repowering/replacement of an original engine in a piece of equipment or a vehicle with an engine from a different manufacturer.

The invention solves this problem with a system that retains ail the original electronic controllers on the piece of equipment and thereby eliminates any need for disturbing the proprietary communication links. Sensor data from the repower engine is read via serial communication by an electronic interface module. The electronic interface module scales or converts the data, or generates new data, and then outputs this data in real time as simulated signals of the original engine's sensors. These outputs are connected to the sensor inputs of the electronic controller of the original engine. The electronic interface module can also interface the equipment's public serial data interface(s), if available, to acquire data that can be used in the simulation of the sensor outputs or can be used in the control of the new engine. When connected to the electronic controller of the original engine, the electronic interface module uses real-time data from the repower engine to simulate that the original engine is still installed in the piece of equipment, thereby allowing any electronically controlled engine to be used as the repower engine. In some instances, and for specific engine models, an injector simulation module, that is not described here, might be required to be connected to the fuel injector outputs of the electronic controller of the original engine to simulate the load characteristics of the original fuel injectors.

The system of the present invention provides numerous advantages in connection with repowering existing equipment. These advantages include:

1) Providing the owner of the equipment with the flexibility of selecting a repower engine based on personal preference, such as of a specific manufacturer.

2) Mowing equipment to be repowered with engines having better fuel economy.

3) Mowing equipment to be repowered with engines that have a longer service life than the original engine.

4) Mowing equipment to be repowered with engines that have cleaner emissions than the original engine.

5) Mowing equipment to be repowered with lighter weight engines.

6) Mowing equipment to be repowered with quieter engines.

7) Allowing equipment to be repowered with engines having different torque characteristics.

8) Mowing equipment to be repowered with engines having different speed characteristics.

9) Allowing equipment to be repowered with lower-cost engines than the original engine.

10) Allowing equipment to be repowered without the need to interface proprietary communication links, thereby saving time and costs.

11) Permitting the equipment to function as originally designed since the equipment does not recognize that a different engine has been installed.

12) Retaining the ability to use original electronic service and diagnostic tools on the original electronic controllers without causing errors.

13) The ability to increase equipment performance by repowering with a higher performance engine, 14) Allowing the repowering of the equipment without the introduction of nuisance alarms, 15) Allowing the life of the equipment to be extended in the event an original replacement engine is no longer available.

The various features of novelty which characterize the invention are pointed out with particularity in the claims annexed to and forming a part of the disclosure. For a better understanding of the invention, its operating advantages, specific objects attained by its use, reference should be had to the drawings and descriptive matter in which there are illustrated and described preferred embodiments of the invention.

DETAILED DESCRIPTION OF THE INVENTION

Figure 1:
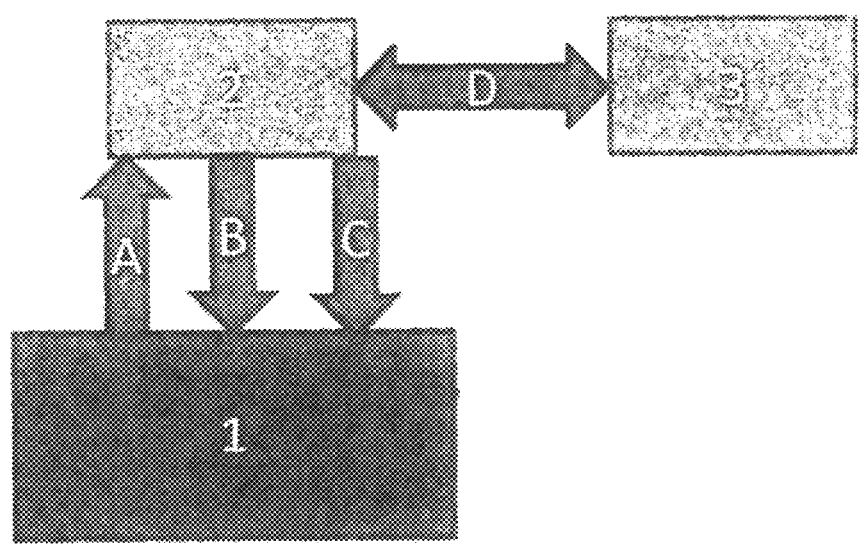
FIG. 1 is a schematic representation of a configuration with the original engine.

FIG. 1 shows a schematic representation of a piece of equipment in which the original engine 1 is controlled by an engine controller 2. The engine controller 2 receives signals A from engine sensors or other sensors in the equipment, for example sensors to determine ambient conditions. The engine controller 2 processes the signals and controls the engine 1 and/or engine related peripheral devices via actuators B.

The engine controller 2 can also be connected to one or more other components 3, such as controllers, displays or data loggers. These additional components can, for example: be the human-machine interface; be involved in the engine control, including processing of relevant data; be connected directly to engine sensors or actuators B and/or C; be connected to the engine controller 2 by analog or digital inputs and outputs, by a data bus, wirelessly or by other means; form a controller network; be on board the equipment or remote; and/or be involved in the control of engine-external components or parameters with relevance for the engine function, for example brakes, transmission or other drivetrain components, cruise control, etc.

The engine sensors and corresponding signals A can be for a wide variety of parameters, including, but not limited to: speed, timing, temperature, pressure, and fluid levels.

The actuators B shown in FIG. 1 represent actuators for a wide variety of different components, such as flaps or valves to control the flow of fluids directly (such as exhaust flaps and coolant thermostats) or indirectly (such as hydraulic valves to control cooling fan speed).

It is possible for the sensors and actuators to be combined in functional modules. However, such combination is not required.

There is no limit to the number of sensors and actuators that can be used in the system of the present invention. Also, the invention does not place any restriction on the function principle of the sensors and actuators. The invention can be utilized with all types of sensors and actuators. For example, a speed sensor principle can be Hall effect based or Variable Reluctance (VR) based. Furthermore, there is no restriction on what types of parameters the sensors and actuators monitor and/or control. The system and method of the present invention can be utilized with all types of parameters which are the state-of-the-art at the present time or may become the state of the art at a later date, for example closed-loop combustion control based on cylinder-pressure monitoring. The number, principle and parameters utilized by the engine simulation system are case specific and can therefore vary from one piece of equipment to another or one vehicle to another.

In the case of combustion engines, a special group of actuators C are those that which supply fuel and initiate combustion. These may include but are not limited to fuel injectors, carburetors, throttle bodies, spark plugs, fuel preparing devices (e.g. heaters/vaporizers etc.). As with the actuators described previously, the remarks regarding the number, function principle and possible modularization applies equally to that this special group of actuators C.

Figure 2:
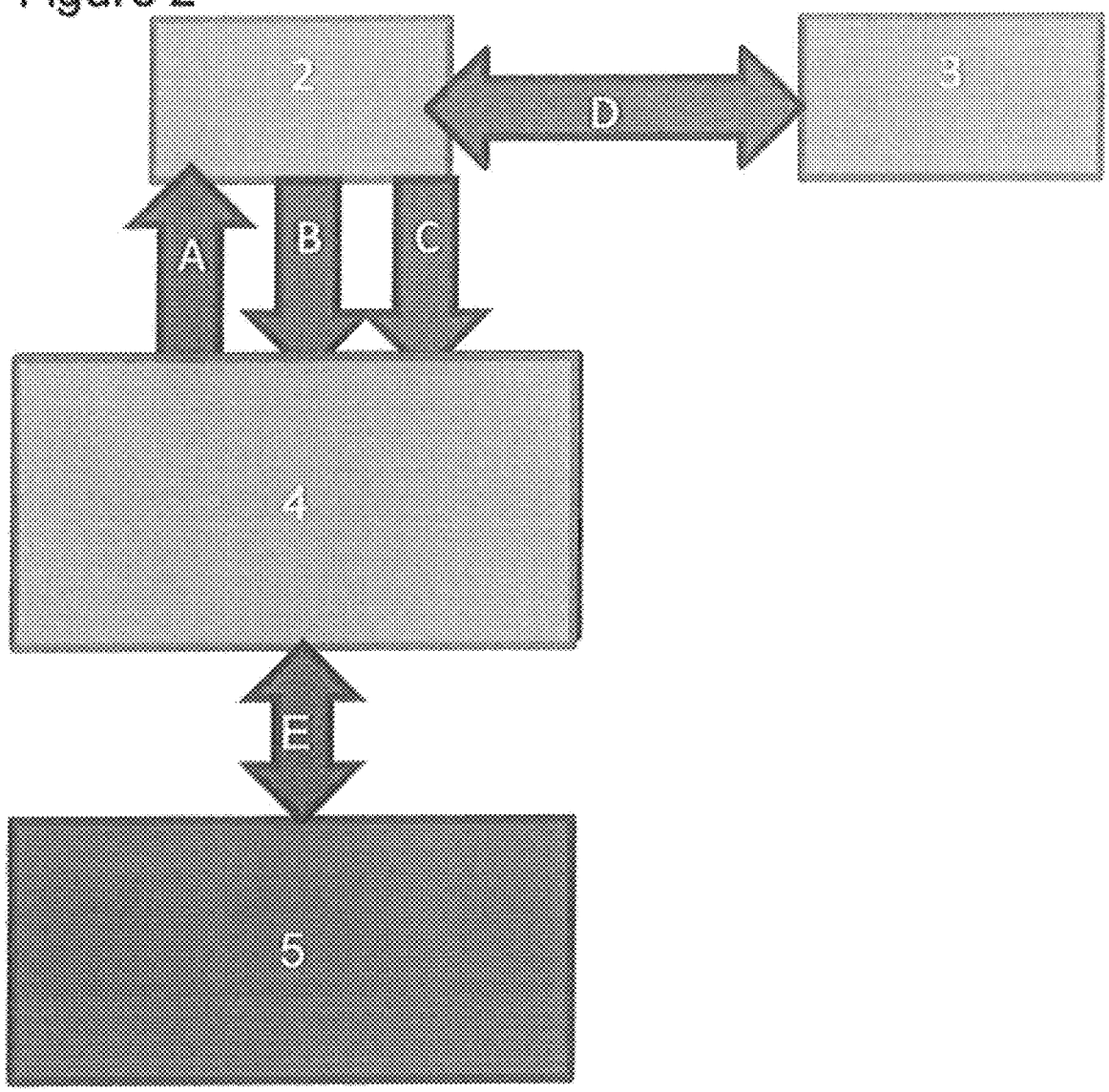
FIG. 2 is a schematic representation of a configuration with a replacement engine

FIG. 2 shows a configuration in which the original engine 1 has been replaced by a different type of engine 5 that also has one or more controllers, sensors, actuators, etc. For simplification, the new engine and all its related devices is shown as a complete system 5. To avoid failures or errors in the communication and function of the original setup of controllers, displays or data loggers 2, 3, D, one or more simulator modules 4 are provided to integrate the new engine 5 into the existing system via at least one interface E. The simulator module 4 is connected to the engine controller of the new engine 5.

The simulation module 4 is configured to generate all inputs of the original engine controller 2 in such a way that they are plausible, for example parameter value ranges matching operating conditions, and that they match the physical properties of the original sensors and actuators, for example voltage level, or current level, or inductance, or load.

The simulator module 4 receives signals of the new engine 5, processes the signals and feeds them A to the engine controller 2. When necessary the simulator module 4 can also create signals that are not related to the actual function of the new engine 5. The outputs B and C of the engine controller 2 may or may not be used to control the new engine 5.

In summary, the engine simulation system of the present invention includes the engine controller 2 of the original engine and a repowered portion that includes the new electronically controlled reciprocating internal combustion engine 5 and an electronic interface module 4 that includes at least one physical electronic controller. The engine controller of the new engine 5 is connected to the interface module 4, which is in turn connected to the engine controller 2 of the original engine.

Figure 3:
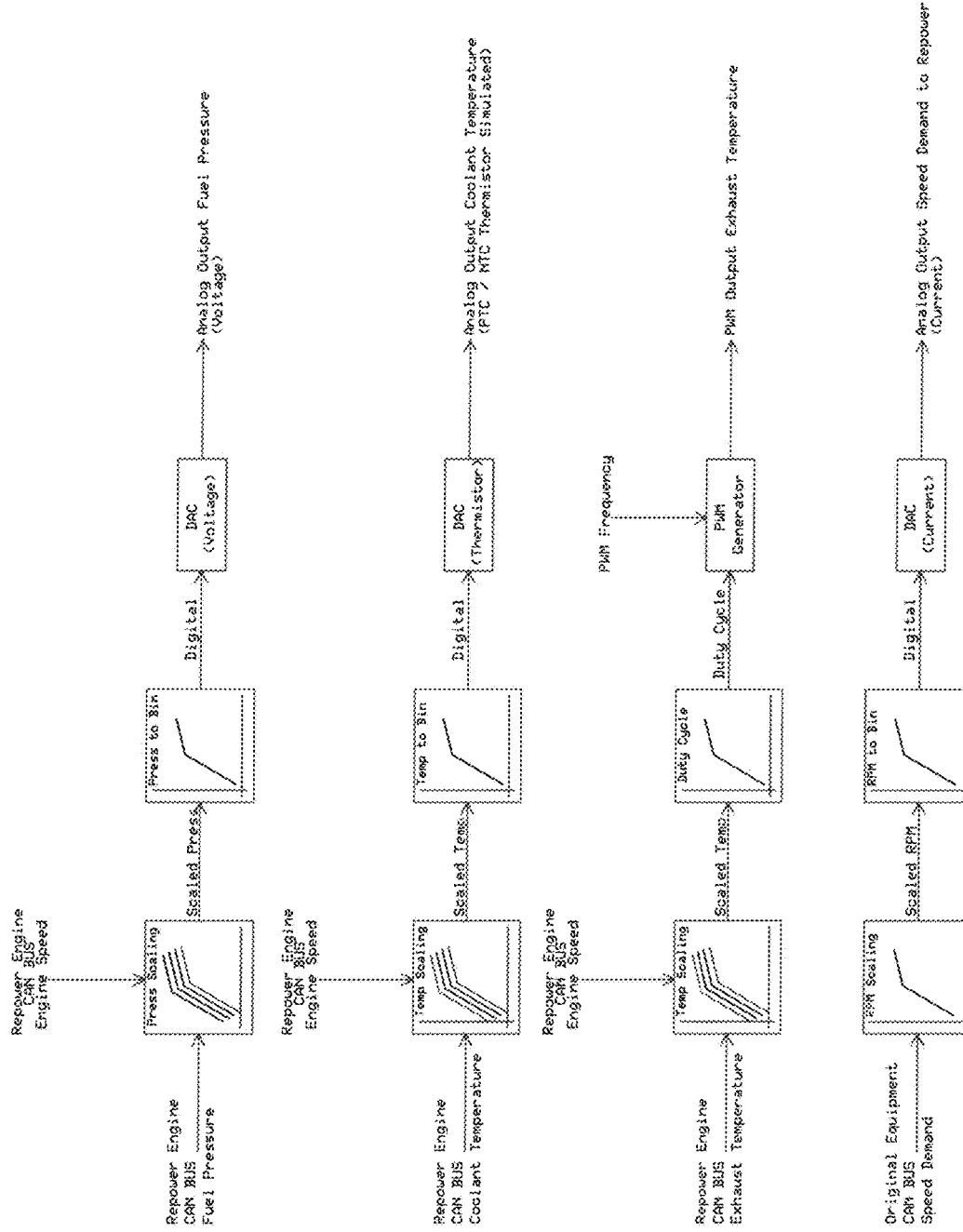
FIG. 3 illustrates the function of the simulator module.

FIG. 3 shows an example of the function of the interface module 4. As can be seen, engine speed together with fuel pressure, coolant temperature and exhaust temperature of the new engine 5 is input to the interface module 4. This input data is processed by the interface module 4 as indicated in FIG. 3 and the interface module 4 outputs the required output signals to the engine controller 2 of the original engine 1. The bottom line in FIG. 3 shows how the interface module 4 can take signals from the engine controller 2 of the original engine 1, in this case speed demand, process this data and output a control signal for speed demand to the engine controller of the new engine 5. This example only shows four representations of signals. It is understood that many additional signals can also be processed by the interface module 4.

Figure 4:
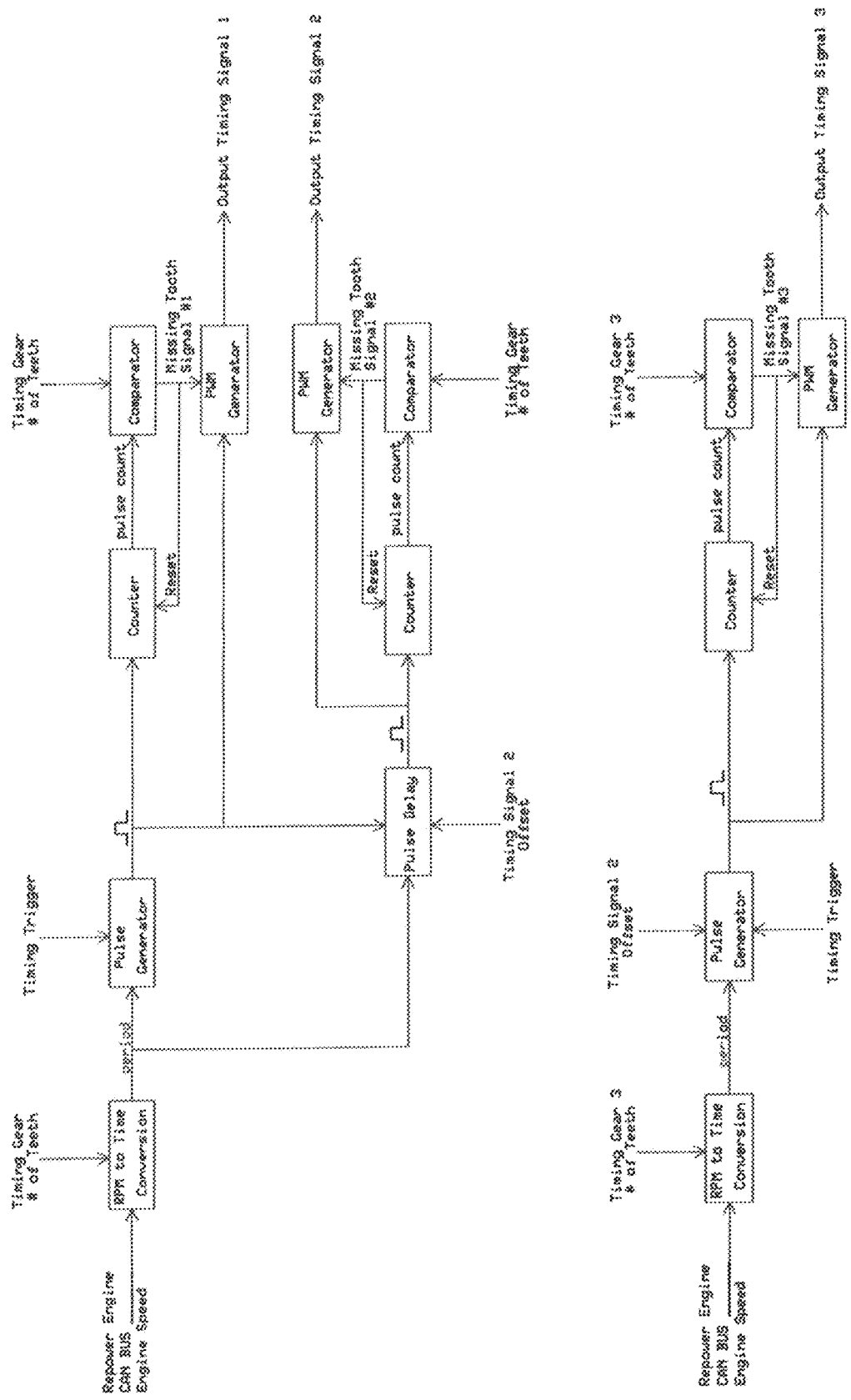
FIG. 4 further illustrates the functioning of the simulator module.

FIG. 4 shows an example of the function of the interface module 4 in which the engine speed signal of the new/repower engine is processed by the interface module to output a timing signal to the engine controller of the original engine.

While specific embodiments of the invention have been shown and described in detail to illustrate the inventive principles, it will be understood that the invention may be embodied otherwise without departing from such principles.

The invention claimed is:

1. An engine simulation system for replacing an original engine in an existing system of a piece of equipment, comprising:
    an engine controller from the original engine; a new engine having an engine controller; and,
    a simulator module connected between the engine controller of the new engine and the engine controller of the original engine, the simulator module being configured to simulate that the original engine is still in the existing system.

2. The engine simulation system according to claim 1, wherein the simulator module is connected to the engine controller of the new engine by an interface.

3. The engine simulation system according to claim 1, wherein the simulator module is electronic and is configured to read sensor data from the new engine.

4. The engine simulation system according to claim 3, wherein the simulator module has data outputs connected to sensor inputs of the engine control of the original engine, the simulator module being configured to process the sensor data and output signals to the engine controller of the original engine that simulate sensor signals of the original engine.

5. The engine simulation system according to claim 3, wherein the simulator module is configured to generate signals not related to actual functions of the new engine but that are required to simulate the sensor signals of the original engine.

6. The engine simulation system according to claim 1, wherein the new engine is an electronically controlled engine.

7. The simulation system according to claim 1, wherein the new engine is an internal combustion engine.

8. The simulation system according to claim 1, wherein the original engine is an electronically controlled internal combustion engine.

9. A method for replacing an original engine in an existing system of a piece of equipment, comprising the steps of:
removing the original engine from the piece of equipment without removing an engine controller of the original engine;
providing a new engine having an engine controller;
connecting a simulator module between the engine controller of the new engine and the engine controller of the original engine; and,
integrating the new engine into the existing system by simulating via the simulator module that the original engine is still in the existing system.

10. The method according to claim 9, including connecting the simulator module to the engine controller of the new engine by an interface.

11. The method according to claim 9, wherein the simulator module is electronic and reads sensor data from the new engine.

12. The method according to claim 11, including connecting data outputs of the simulator module to sensor inputs of the engine control of the original engine, the simulator module processing the sensor data and outputting signals to the engine controller of the original engine that simulate sensor signals of the original engine.

13. The method according to claim 11, wherein the simulator module generates signals not related to actual functions of the new engine but that are required to simulate the sensor signals of the original engine.

14. The method according to claim 9, wherein the new engine is an electronically controlled engine.

15. The method according to claim 9, wherein the new engine is an internal combustion engine.

16. The method according to claim 9, wherein the original engine is an electronically controlled internal combustion engine.

\* \* \* \* \*

UNITED STATES PATENT AND TRADEMARK OFFICE
CERTIFICATE OF CORRECTION

PATENT NO.       : 10,890,131 B2
APPLICATION NO.  : 16/563431
DATED            : January 12, 2021
INVENTOR(S)      : Alexander Bernhard Richter It is certified that error appears in the above-identified patent and that said Letters Patent is hereby corrected as shown below:

In the Specification

Delete the data from Column 1, Line 25 to Column 2, Line 34 and insert the following:
-- SUMMARY OF THE INVENTION
It is an object of the present invention to provide a system and method that allow the repowering/replacement of an original engine in a piece of equipment or a vehicle with an engine from a different manufacturer.
The invention solves this problem with a system that retains all the original electronic controllers on the piece of equipment and thereby eliminates any need for disturbing the proprietary communication links. Sensor data from the repower engine is read via serial communication by an electronic interface module. The electronic interface module scales or converts the data, or generates new data, and then outputs this data in real time as simulated signals of the original engine's sensors. These outputs are connected to the sensor inputs of the electronic controller of the original engine. The electronic interface module can also interface the equipment's public serial data interface(s), if available, to acquire data that can be used in the simulation of the sensor outputs or can be used in the control of the new engine. When connected to the electronic controller of the original engine, the electronic interface module uses real-time data from the repower engine to simulate that the original engine is still installed in the piece of equipment, thereby allowing any electronically controlled engine to be used as the repower engine. In some instances, and for specific engine models, an injector simulation module, that is not described here, might be required to be connected to the fuel injector outputs of the electronic controller of the original engine to simulate the load characteristics of the original fuel injectors.
The system of the present invention provides numerous advantages in connection with repowering existing equipment. These advantages include:
1) Providing the owner of the equipment with the flexibility of selecting a repower engine based on personal preference, such as of a specific manufacturer.
2) Allowing equipment to be repowered with engines having better fuel economy.
3) Allowing equipment to be repowered with engines that have a longer service life than the original engine.

Signed and Sealed this
Eleventh Day of May, 2021

Drew Hirshfeld
*Performing the Functions and Duties of the
Under Secretary of Commerce for Intellectual Property and
Director of the United States Patent and Trademark Office*

4) Allowing equipment to be repowered with engines that have cleaner emissions than the original engine.
5) Allowing equipment to be repowered with lighter weight engines.
6) Allowing equipment to be repowered with quieter engines.
7) Allowing equipment to be repowered with engines having different torque characteristics.
8) Allowing equipment to be repowered with engines having different speed characteristics.
9) Allowing equipment to be repowered with lower-cost engines than the original engine.
10) Allowing equipment to be repowered without the need to interface proprietary communication links, thereby saving time and costs.
11) Permitting the equipment to function as originally designed since the equipment does not recognize that a different engine has been installed.
12) Retaining the ability to use original electronic service and diagnostic tools on the original electronic controllers without causing errors.
13) The ability to increase equipment performance by repowering with a higher performance engine.
14) Allowing the repowering of the equipment without the introduction of nuisance alarms.
15) Allowing the life of the equipment to be extended in the event an original replacement engine is no longer available.
The various features of novelty which characterize the invention are pointed out with particularity in the claims annexed to and forming a part of the disclosure. For a better understanding of the invention, its operating advantages, specific objects attained by its use, reference should be had to the drawings and descriptive matter in which there are illustrated and described preferred embodiments of the invention. --